United States Patent
Yamaguchi et al.

(10) Patent No.: US 7,473,476 B2
(45) Date of Patent: Jan. 6, 2009

(54) SOLDERING METHOD, COMPONENT TO BE JOINED BY THE SOLDERING METHOD, AND JOINING STRUCTURE

(75) Inventors: Atsushi Yamaguchi, Osaka (JP); Kazuto Nishida, Osaka (JP); Masato Hirano, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 10/770,955

(22) Filed: Feb. 3, 2004

(65) Prior Publication Data

US 2004/0155336 A1 Aug. 12, 2004

(30) Foreign Application Priority Data

Feb. 5, 2003 (JP) ............... P.2003-028032

(51) Int. Cl.
*B32B 15/01* (2006.01)
(52) U.S. Cl. ............... 428/646; 428/658; 428/671
(58) Field of Classification Search ......... 428/648; 174/260; 228/215
See application file for complete search history.

(56) References Cited

U.S. PATENT DOCUMENTS

| | | | | |
|---|---|---|---|---|
| 5,356,526 A | * | 10/1994 | Frankenthal et al. | 205/122 |
| 5,535,526 A | * | 7/1996 | White | 34/78 |
| 5,538,686 A | * | 7/1996 | Chen et al. | 420/557 |
| 6,437,989 B1 | * | 8/2002 | Lopatin et al. | 361/760 |
| 6,814,276 B2 | * | 11/2004 | Yamaguchi | 228/208 |
| 6,853,077 B2 | * | 2/2005 | Oida et al. | 257/738 |
| 7,018,721 B2 | * | 3/2006 | Nakamura | 428/646 |
| 2002/0179328 A1 | * | 12/2002 | Sakai et al. | 174/260 |

FOREIGN PATENT DOCUMENTS

| | | |
|---|---|---|
| CN | 1266989 C | 7/2006 |
| JP | 2000-260801 | 9/2000 |
| JP | 2001-298051 A | 10/2001 |
| JP | 2001-308144 A | 11/2001 |
| WO | 02-05609 A1 | 1/2002 |

OTHER PUBLICATIONS

Japanese Office action with English translation.

* cited by examiner

*Primary Examiner*—Kiley Stoner
(74) *Attorney, Agent, or Firm*—Pearne & Gordon LLP

(57) ABSTRACT

It is possible to prevent deterioration of a soldering portion and improve strength of thermal fatigue resistance by providing barrier metal layers on at least one of lead and land to cover parent materials comprising Cu-containing materials, feeding a soldering material between the lead and the land and allowing to contact in a fused condition with barrier metal layers and solidify, and thus soldering together the lead and the land.

20 Claims, 1 Drawing Sheet

SOLDERING METHOD, COMPONENT TO BE JOINED BY THE SOLDERING METHOD, AND JOINING STRUCTURE

The present application is based on Japanese Patent Application No. 2003-028032, which is incorporated herein by reference.

BACKGROUND OF THE INVENTION

1. Field of the Invention

The present invention relates to a method for soldering one member to another member, and more specifically to a method for soldering a land formed on a board and an electrode of electronic component (e.g., lead) in a process of manufacturing an electronic circuit board. Furthermore, the invention relates to a joining structure obtained by this soldering method and an electrical component or an electronic component used in this soldering method.

2. Description of the Related Art

In processes for manufacturing an electronic circuit board used for the electronic equipment, the method of reflow soldering has hitherto been known as one of methods used for mounting an electronic component on a board, more specifically for joining electrically and physically a lead pulled out of the electronic component to a land formed on the board.

In a general method of reflow soldering, at first, a so-called cream solder (not shown in drawings) is provided by screen printing on a land that is part of a wiring pattern formed on the board. The cream solder in general is made by mixing a solder powder comprising a soldering material with a flux comprising rosin, activating agent, and solvent. Thereafter, an electronic component is set on a prescribed portion of a board so that a lead pulled out of the electronic component adheres to the cream solder set on the land to be joined. The flux is activated by a thermal treatment of the board on which the electronic component is thus set through the cream solder at a temperature higher than the melting point of the soldering material used, thus a soldering material forming the solder powder in the cream solder is once fused, and simultaneously other components such as the flux in the cream solder is allowed to evaporate (or volatilize). Subsequently, the soldering material fused is solidified by cooling (or standing for cooling) The solidified soldering material forms a joining portion between the lead of the electronic component and the land of the board to join them electrically and physically. Although other components than the soldering material such as the flux can exist in the joining portion, these other components causes phase separation from the soldering material at the thermal treatment, fail to exist inside the joining portion, and only remain slightly on the surface of the portion. Thus, an electronic circuit board having the electronic component mounted on the board by the joining portion (or soldering portion) comprising the soldering material substantially is obtained.

Soldering materials used generally include Sn—Pb series materials, particularly that having an eutectic composition (Hereinafter simply referred to as a Sn—Pb eutectic material). It is known that the eutectic composition of the Sn—Pb series material is a Sn—37Pb composition (i.e., a composition consisting of 37 weight percent of Pb and the residual Sn (of 63 weight percent)), and the Sn—Pb series material has a melting point of 183° C. in this eutectic composition. For example, see Unexamined Japanese Patent Publication No. 2000-260801.

In recent years, the waste disposal of electronic equipment having the above-described electronic circuit board have offered a problem, and effects on the global environment and the human body exerted by the lead (Pb) contained in soldering materials have become a matter of concern. Therefore, there's movement toward use of materials containing no lead, that is, lead-free soldering materials as soldering materials in place of the Sn—Pb series materials used so far, and the practical use thereof has been attempted.

Recently, materials having various compositions have been proposed as the lead-free soldering materials and one of such materials is a Sn—Zn series material. As a result of recent studies, it was found that the Sn—Zn series material had an eutectic composition of about Sn—9Zn (i.e., nine weight percent of Zn and the residual Sn (91 weight percent)) and the Sn—Zn series material had a melting point of 199° C. in the eutectic composition.

It is desirable that the melting point of the lead-free soldering materials are sufficiently low to the extent that the electronic component is not damaged and is comparatively near to the melting point of the conventional Sn—Pb series materials in consideration of the heat-resistant temperature of the electronic component to be mounted on a board and the application of an existing soldering method. Since the melting points of the above-described Sn—Zn series materials are lower than those of other lead-free soldering materials such as Sn—Ag series materials and comparatively near to those of the Sn—Pb series materials, the Sn—Zn series materials are expected as leading substitutes for the Sn—Pb series materials.

Although use of the Sn—Zn series materials in place of the Sn—Pb series materials had an advantage of soldering an electronic component to a board without causing thermal damage to the electronic component, however, it was found that the joining portion between the land of the board and the lead of the electronic component was deteriorated and no sufficient strength of thermal fatigue resistance was obtained as a result of the continuous use test of the resulting electronic circuit board under a condition of high temperature.

This is thought to be caused by contact of lead (Zn) contained in the Sn—Zn series materials with copper (Cu) used as a material of the land and the lead and forming an intermetallic compound comprising Cu and Zn at the joining interfaces between the joining portion and the land and between the joining portion and the lead.

An electronic circuit board prepared by soldering an electronic component and a board by use of a cream solder containing cream powder comprising the Sn—Zn series material in place of the Sn—Pb series material according to the above-described conventional method of reflow soldering is hereinafter illustrated through FIG. 2.

In this electronic circuit board, a land 7 formed on a board 6 and a lead 9 pulled out of an electronic component 10 are joined electrically and mechanically. The land 7 in general is made of Cu and formed in one united body with a wiring pattern. Furthermore, the lead 9 in general is prepared by covering a parent material 9a made of Cu with a plating 9b comprising a Sn—Pb eutectic material. A joining portion 8 is formed by a thermal treatment of the cream solder, and formed substantially of a soldering material stemming from the solder powder as described above.

Although freedom from lead is promoted also as to a soldering material for the lead of an electronic component at present, the Sn—Pb series materials are still used nowadays as a transition period in some cases.

Since the soldering material directly contacts with the land 7 in the thermal treatment, Cu forming the land diffuses into the soldering material and combines with Zn to form an intermetallic compound 11 comprising Cu and Zn at this joining interface.

Furthermore, as the soldering material of solder powder fuses in the thermal treatment, the plating 9b consisting of a Sn—Pb eutectic material having a melting point lower than the temperature of the thermal treatment also fuses, the portion of the plating 9b contacting with the soldering material in a fused condition fuses and diffuses into the soldering material. Consequently, the plating 9b of the lead 9 is peeled off at places and the parent material 9a comes to contact directly with the soldering material in the fused condition. Accordingly, the Cu composing the parent material 9a of the lead 9 diffuses into the soldering material similarly as described above and combines with Zn to form an intermetallic compound 12 comprising Cu and Zn at the joining interface.

When the board having the electronic component soldered as described above are placed particularly under a condition of high temperature for a long period of time, more much Cu diffuses into the joining portion (or the soldering material) to promote the formation of the intermetallic compounds 11 and 12 comprising Cu and Zn. All Zn in the soldering material is soon consumed for the formation of the intermetallic compound comprising Cu and Zn, subsequently Cu remaining without contributing to the formation of the intermetallic compound and/or Cu composing the Cu—Zn intermetallic compound diffuse into the soldering material, and spreading diffusion of Sn in the soldering material into voids produced by the diffusion of the Cu, that is, interdiffusion occurs. This phenomenon is thought to invite the deterioration of the joining portion.

Also, in the case where a cream solder containing the solder powder comprising the Sn—Pb series material is conventionally used, the copper (Cu) used as a material for the land and/or the lead diffuses into the joining portion and combines with tin (Sn) contained in the Sn—Pb series material, and thereby the intermetallic compound comprising Sn and Cu can be formed between the joining interfaces and the land and/or the lead at the joining portion. However, since the intermetallic compound comprising Sn and Cu is stable, the compound can endure continuous use under a condition of high temperature. Accordingly, the formation of the intermetallic compound comprising Sn and Cu is thought to invite no problem of deterioration of the joining portion that occurs in the case of the intermetallic compound comprising Cu and Zn.

Furthermore, a Fe—42Ni alloy material (i.e., an alloy material having a composition comprising 42 weight percent of Ni and the residual Fe (58 weight percent)) is used in some cases as the material for the parent material 9a of the lead 9 as well as Cu. In this case, the intermetallic compound 12 comprising Cu and Zn is not formed at the interface between the lead 9 and the joining portion 8 by allowing the plating 9b on the lead 9 to fuse and diffuse into the soldering material and allowing the parent material 9a to contact directly with the soldering material. However, since the intermetallic compound 12 comprising Cu and Zn is still formed at the interface between the land 7 comprising Cu and the joining portion 8, deterioration of the joining portion occurs when the resulting electronic circuit board is subjected to a continuous use test under a condition of high temperature. Accordingly, this alloy material also has the problem of having no sufficient strength of thermal fatigue resistance.

Although the Sn—Zn series material has been described above in detail, other soldering materials containing at least Sn and Zn also encounters similar problems.

SUMMARY OF THE INVENTION

The object of the invention is to provide a soldering method that can prevent deterioration of the soldering portion (or joining portion) caused by continuous use under a condition of high temperature and can obtain a sufficient strength of thermal fatigue resistance, which is a problem inherent in the case where soldering (or joining) of an electronic component and a board is carried out by use of the soldering materials containing Sn and Zn such as the Sn—Zn series material, and an electronic circuit board obtained by this method.

According to one of the points of the present invention, the invention provides a method for soldering (or joining. The same shall apply hereinafter.) the first member and the second member by use of a soldering material containing Sn and Zn such as the Sn—Zn series material, wherein a barrier metal layer to cover a parent material comprising a Cu-containing material is provided on at least one of the first member and the second member, a soldering material is fed (or set) between the first member and the second member and allowed to contact with the barrier metal layer in a fused condition and solidify.

According to the above-described soldering method, since the parent material comprising a Cu-containing material is covered with the barrier metal layer and the soldering material containing Sn and Zn contacts with the barrier metal layer, direct contact of the Zn of the soldering material with the Cu contained in the parent material can be evaded. This enables an effective inhibition or prevention of the formation of an intermetallic compound comprising Cu and Zn, and thereby the cause of deterioration of a soldering portion (also referred to as a joining portion in this specification) caused by continuous use under a condition of high temperature and furthermore the cause of reduction in strength of thermal fatigue resistance can be excluded.

When both of the first member and the second member are made of the Cu-containing material and Cu can diffuse from both members into the soldering material (or the joining portion) in the invention, it is preferable that the Cu-containing material is covered with the barrier metal layer to evade direct contact with the soldering material, thereby to prevent the formation of the intermetallic compound comprising Cu and Zn. However, the invention is not necessarily limited to this and even in the above-described case, deterioration in strength of thermal fatigue resistance can be reduced by providing the barrier metal layer for either of both members as compared with the case where no barrier metal layer is provided at all.

Although the barrier metal layer may be formed of either of a monolayer and multilayer in the invention, it is necessary to cover the parent material containing Cu so that the parent material does not substantially contact with the soldering material in a fused condition. Accordingly, materials of the barrier metal layer used preferably include those that do not substantially diffuse (dissolve) into the soldering material in a fused condition or do not substantially contact with the soldering material by exposure of the parent material containing Cu positioned in the lower portion thereof even if the materials diffuses. In the present specification, on the basis of the parent material of the member to be soldered, the exposed surface side to contact with the soldering material is referred to as the "upside" whereas the side of the parent material is referred to as the "downside".

In a preferred embodiment of the invention, the barrier metal layer can be a Ni layer (i.e., a layer made of Ni, other layers as described later are similar to this manner) or a multilayer laminate. Since Ni hardly diffuse into a soldering material by contacting with the soldering material and the parent material positioned on downside of it is not exposed, the Ni is suitable as a material for the barrier metal layer.

When a multilayer laminate containing a Ni layer is used as the barrier metal layer, an Au layer can be provided on the upside of the Ni layer. The Ni layer is subject to oxidation in the air and comparatively inferior in wettability to the soldering material because of formation of the oxide. However, when the Au layer is provided on the upside of the Ni layer, the Au layer is more resistant to oxidation than the Ni layer and shows a good wettability to the soldering material. By providing this layer on the upside of the Ni layer to form the surface of the barrier metal layer, the wettability to the soldering material can be improved as compared with use of the single Ni layer as the barrier metal layer and thereby the reliability to joining of the joining portion (mainly, bonding strength) can be improved.

The layer composing the barrier metal layer (at least one layer when the barrier metal layer is a multilayer laminate) can be formed by methods known in this technical field, for example, electroplating, hot-dip plating, immersion plating, vapor deposition, and the like.

According to another point of the invention, a joining structure having the first member and the second member soldered by use of a soldering material containing Sn and Zn wherein at least one of the first member and the second member is equipped with a parent material comprising a Cu-containing material and a barrier metal layer covering the parent material is provided.

Since the parent material comprising a Cu-containing material is covered with the barrier metal layer also in this joining structure, the formation of the intermetallic compound comprising Cu and Zn is effectively inhibited or prevented similarly to the above-described soldering method of the invention. Consequently, the joining structure can maintain a high strength of thermal fatigue resistance without causing deterioration of the joining portion in the continuous use under a condition of high temperature.

Although the barrier metal layer of the joining structure prepared by the soldering method of the invention leaves the Ni layer, when the Ni layer and the Au layer positioned on the upside of the Ni layer are used, the Au and Zn are allowed to react on the upside of the Ni layer and to form an Au—Zn compound in a layer state without elution (or fusion diffusion) of the Au into the soldering material caused by contact of the Au layer with the soldering material in a fused condition, thus it is possible to obtain a higher adhesive power and a higher strength of thermal fatigue resistance than the single Ni layer.

In the invention, the first member and the second member can be a board and an electronic component and in more detail, can be an electrode provided on the board and an electrode of electronic component, respectively.

The above-described board includes those made of paper phenolic materials, glass epoxy materials, polyimide film materials, ceramic materials, and metallic materials, and the like. The electrode formed on such board can be, for example, a land formed in one united body with a wiring pattern and can be prepared, for example, by covering the parent material comprising Cu with the barrier metal layer.

The electronic component as described above includes semiconductor components (e.g., so-called QFP (Quad Flat Package) component, CSP (Chip Scale Package) component, and SOP (Single Outside Package) component, etc.), chip components (e.g., resistance, condenser, transistor, inductor), and connectors and the like. These electrodes of electronic components can be, for example, leads or terminals pulled out of electronic components and can be prepared, for example, by covering a parent material comprising Cu with a barrier metal layer.

However, the invention is not limited by these members, and the first member and the second member can be various members to be soldered up. Accordingly, according to further another point of the invention, an electrical component or an electronic component having an electrode equipped with a parent material comprising a Cu-containing material and a barrier metal layer covering the parent material, which is to be soldered by use of a soldering material containing Sn and Zn also, can be provided.

In this specification, the soldering material means a metallic material having a comparative low melting point, that is, a metallic material that fuses at temperature of about 100 to about 250° C. Of these soldering materials, the soldering materials containing Sn and Zn are those containing at least Sn and Zn, for example, can be Sn—Zn series materials (containing Sn—Zn eutectic material and Sn—Zn—Bi materials to which Bi is added to the Sn—Zn eutectic material). Furthermore, an "A-B series material" means a material that further can contain a trace of another metallic component on a basis of eutectic composition comprising metallic components A and B. For example, the Sn—Zn series materials can contain a trace amount of another metallic component (It is not important whether the another metallic component is intentionally added or inevitably contained) in addition to the eutectic composition of Sn—9Zn. The Sn—Zn series materials can have a melting point between about 190 and about 200° C.

The skilled person in the art will readily understand that in the invention, for example, soldering can be carried out by any of the reflow soldering method and flow soldering method, and any of soldering of only one side of a board and soldering of both sides thereof also can be carried out, and furthermore the joining structure of the invention can be prepared by any of these methods.

The concept of preventing the contact of Cu with Zn by providing a barrier metal layer in the invention will be appropriately utilized when abuses due to formation of the intermetallic compound comprising Cu and Zn that coexist are desired to be excluded.

The soldering method in the invention can be understood also as the method for preparing the joining structure where the first member and the second member are soldered.

DETAILED DESCRIPTION OF THE PREFERRED EMBODIMENTS

Figure 1:
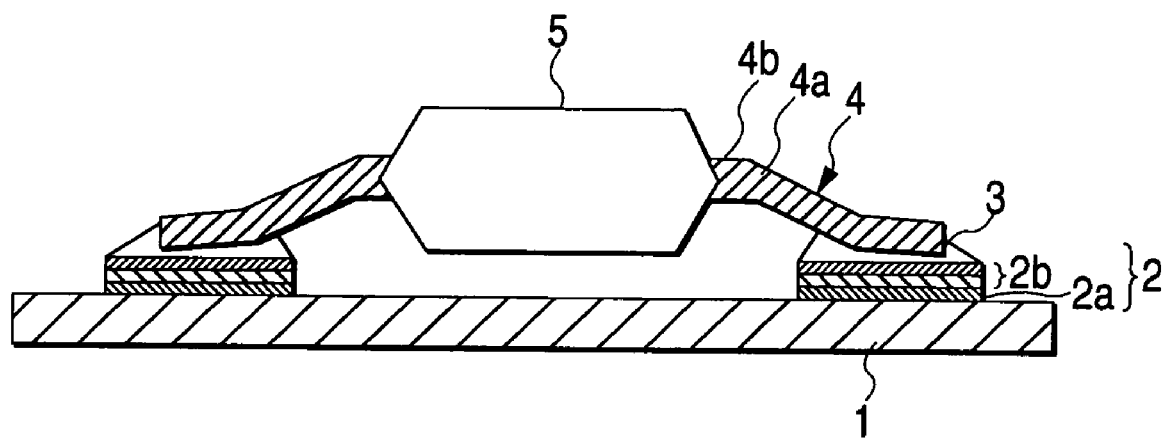
FIG. 1 shows a schematic partial sectional view of an electronic circuit board prepared by a soldering method in one mode for carrying out this invention.
Figure 2:
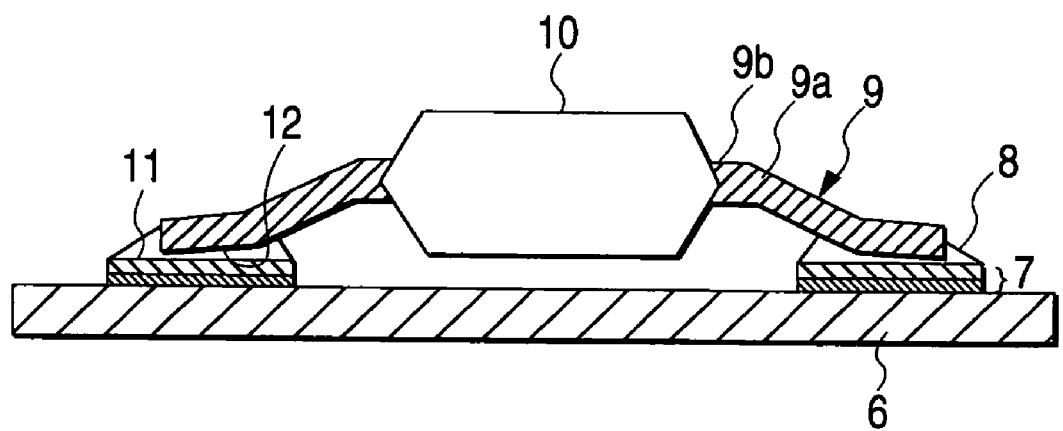
FIG. 2 shows a schematic partial sectional view of an electronic circuit board prepared by a conventional soldering method.

One mode for execution is hereinafter illustrated through FIG. 1. FIG. 1 is a schematic partial sectional view of an electronic circuit board prepared by the soldering method in this mode for execution.

First, a board 1 and electronic component 5 to be joined thereto are prepared. A land 2 prepared by covering a parent material 2a comprising Cu with a barrier metal layer 2b comprising a Ni layer and an Au layer is formed on the board 1, and the land 2 can be formed, for example, according to the following method.

For example, the parent material 2a comprising Cu is formed in one united body with a wiring pattern (not shown in the figure) on the upper surface of the board 1 made of a glass epoxy resin or the like by thermo-compression bonding (or mounting) of copper foil and etching. The wiring pattern can have a width of, for example, about 50 to about 100 μm. Thereafter, a resist is formed in a prescribed region of the surface of the board 1 to cover the wiring pattern. Then, the parent material 2a is exposed without being covered with the resist. The height of the parent material 2a (i.e., the height of the wiring pattern) is adjusted, for example, to about 10 to about 40 μm.

A Ni layer is formed by immersing the board 1 on which the parent material 2a is thus formed in an electrolyte having Ni dissolved and applying an appropriate voltage to the parent material 2a to deposit Ni on the surface of the parent material 2a by the use of electroless plating. The height of the Ni layer can be adjusted, for example, to about 2 to about 5 μm. Furthermore, if a gold plate is formed, for example, so as to be from 0.01 μm to 0.1 μm on the Ni surface by immersion plating, the land 2 comprising the parent material 2a and the barrier metal layer 2b (in this mode for execution, Ni/Au layer) covering the parent material can be formed on the surface of the board 1. Looking at the board 1 from above, the land 2 has a rectangular outline and can be, for example, about 0.5 to about 2 mm in width and about 0.5 to about 2 mm in length, but in this mode for execution, the land can have an arbitrary suitable shape and size without limitation as described above.

Although the method for forming the Ni layer by electroplating was shown in this mode for execution, in addition to this method, the Ni layer covering the parent material 2a can be formed, for example, by hot-dip plating where the board 1 having the parent material 2a formed is dipped into a Ni material in a fused condition, immersion plating where this board is immersed in a solution containing a metal for plating to substitute the surface of the parent material 2a with a metal for plating, or vapor deposition where Ni is evaporated and deposited on the parent material 2a. The person skilled in the art will be able to carry out the electroplating, hot-dip plating, and vapor deposition by setting suitable conditions.

On the other hand, a lead 4 is provided on electronic component 5. The lead is prepared by covering a parent material 4a made of Cu with a barrier metal layer 4b formed of a Ni monolayer. This lead can be prepared beforehand by forming a Ni layer on the surface of the parent material 4a as the barrier metal layer 4b according to the method as described above, and electronic component 5 can be prepared by use of this lead.

A cream solder is provided on the land 2 of the board 1 prepared as described above, for example, by screen printing or a dispenser. This cream solder is prepared by dispersing a Sn—Zn series material, for example, a metallic particle (or solder powder) consisting of a Sn—Zn eutectic material into flux. Commercial available flux comprising rosin, an activator, and solvent can be used as the flux. The metallic particle can have an average particle size of, for example, about 20 to about 40 μm and can exist in a ratio of about 85 to about 90 weight percent to the total cream solder.

Then, the electronic component 5 is appropriately set on the board 1 so that the lead 4 of the electronic component contacts with the cream solder supplied on the land 2. Herein, the cream solder contacts with the barrier metal layer 4b of the lead 4 and the barrier metal layer 2b of the land 2 and fails to contact parent materials 4a and 2a. The board 1 thus prepared is subjected to a thermal treatment by allowing it to pass through a hot atmosphere of, for example, from about 205 to about 230° C., and preferably from about 210 to about 220° C. By this treatment, heat is supplied to the cream solder, the Sn—Zn series material forming the metallic particle in the cream solder is fused, and simultaneously other components than the metallic particle in the flux is evaporated (or vaporized) and removed.

The Sn—Zn series material in a fused condition contacts with the barrier metal layers 2b and 4b, but fails to contact directly with parent materials 2a and 4a because Ni forming these layers does not nearly fuse and diffuse. Accordingly, formation of the intermetallic compound comprising Cu and Zn is prevented. Then, in order to form the Au—Zn compound layer in a layer state by reacting Au positioned on the upside of Ni reacts with Zn in the solder and in order to improve the adhesion to solder, the soldering must be carried out at temperature of from about 205 to about 230° C. and preferably from about 210 to about 220° C. Temperature higher than the above-described temperature allow Au and Zn to react and fuse in the solder without forming a compound in a layer state, and thereafter form a granular Au—Zn compound. In temperature lower than the above-described temperature, Au and Zn fail to react sufficiently. The thickness of the Au—Zn compound layer is preferably from 0.01 to 0.1 μm. Exceeding this range of thickness causes fragileness in joining property of the Au—Zn layer and contrarily, when a thickness does not reach this range, the effect hardly is obtained.

Subsequently, the board 1 having undergone the thermal treatment is cooled (or stand for cooling) to solidify the Sn—Zn series material in a fused condition, thus forming a joining portion (or soldering portion) 3 comprising substantially the Sn—Zn series material. The lead 4 of an electronic component 5 and the land 2 of the board 1 are electrically and mechanically joined (or soldered) through the joining portion 3.

According to the above-described process, an electronic circuit board mounting where the electronic component 5 is mounted on the board 1 is prepared. The formation of the intermetallic compound comprising Cu and Zn can be prevented in any of the joining interface between the lead 4 of the electronic component 5 and the joining portion 3 and the joining interface between the land 2 of the board 1 and the joining portion 3 in the resulting electronic circuit board.

Although the inventors supposed in this mode for execution that both parent materials of the land and the lead comprise Cu and are covered with the respective barrier metal layers, the invention is not limited to this and it is sufficient that at least one of both parent materials contains Cu and the parent material containing Cu is covered with a barrier metal layer. For example, when the parent material of a lead comprises a Fe—42Ni alloy material and contains no Cu, it is not always necessary to cover the parent material with a barrier metal layer and it is enough just to cover the parent material with a solder comprising, for example, a Sn—Pb series material or the like.

According to the present invention, in the method of soldering the first member and the second member by use of a soldering material containing Sn and Zn, at least one of the first member and the second member has a portion comprising a Cu-containing material as a parent material, a barrier metal layer covering the parent material is provided, a soldering material in a fused condition is allowed to contact with the barrier metal layer and solidify, thus to solder (or join) the first member and the second member.

According to this soldering method, the Zn in the soldering material fails to directly contact with the Cu contained in the parent material, and thereby the formation of the intermetallic compound comprising Cu and Zn can be effectively inhibited or prevented, thus to expel deterioration of the joining portion due to continuous use under a condition of high temperature and furthermore the cause inviting deterioration in strength of thermal fatigue resistance.

In addition, according to the invention, in a joining structure where the first member and the second member are soldered by use of a soldering material containing Sn and Zn, at least one of the first member and the second member is equipped with the parent material comprising a Cu-containing material and a barrier metal layer covering the parent material, and accordingly the same effect as described above can be obtained.

Although the invention has been described in its preferred form with a certain degree of particularity, it is understood that the present disclosure of the preferred form can be changed in the details of construction and in the combination and arrangement of parts without departing from the spirit and the scope of the invention as hereinafter claimed.

What is claimed is:

1. A joined structure, comprising; first and second members, the first member comprising Cu;
   a soldering material comprising Sn and Zn between the first and second members; and
   a layer comprising an Au-Zn compound between the first member and the soldering material, the Au-Zn compound being formed in a layer state,
   wherein there is no elution or fusion diffusion of the Au into the soldering material.

2. The joined structure of claim 1, wherein a thickness of the layer comprising the Au—Zn compound in a layer state is about 0.01 to about 0.1 μm.

3. The joined structure of claim 1, further comprising a barrier metal layer between the first member and the layer comprising an Au—Zn compound in a layer state.

4. The joined structure of claim 3, wherein the barrier metal layer comprises Ni.

5. The joined structure of claim 3, wherein the barrier metal layer comprises a Ni layer and an Au layer, the Ni layer being adjacent to the first member.

6. The joined structure of claim 1, wherein the second member comprising Cu, and the structure further comprises a second layer comprising an Au—Zn compound between the second member and the soldering material, the Au—Zn compound being a layer state, not a granular state.

7. The joined structure of claim 6, wherein a thickness of the second layer comprising the Au-Zn compound in a layer state is about 0.01 to about 0.1 μm.

8. The joined structure of claim 6 further comprising at least one of a first barrier metal layer between the first member and the layer comprising an Au—Zn compound or a second barrier metal layer between the second member and the second layer comprising an Au—Zn compound, the Au—Zn compounds being a layer state, not a granular state.

9. The joined structure of claim 8, wherein the first and second barrier metal layers comprise Ni.

10. The joined structure of claim 8, wherein the first and second barrier metal layers comprise Ni layers and Au layers, the Ni layers being adjacent to the first and second members, respectively.

11. A joined structure; comprising; a lead of an electronic component and a land on a board, the land comprising Cu;
    a soldering material comprising Sn and Zn between the lead and land;
    a layer comprising an Au—Zn compound between the land and the soldering material, the Au—Zn compound being formed in a layer state,
    wherein there is no elution or fusion diffusion of the Au into the soldering material.

12. The joined structure of claim 11, wherein a thickness of the layer comprising the Au—Zn compound in a layer state is about 0.01 to about 0.1 μm.

13. The joined structure of claim 12 further comprising a barrier metal layer between the land and the layer comprising the Au—Zn compound in a layer state.

14. The joined structure of claim 13, wherein the barrier metal layer comprises Ni.

15. The joined structure of claim 13, wherein the barrier metal layer comprises a Ni layer and an Au layer, the Ni layer being adjacent to the land.

16. The joined structure of claim 11, wherein the lead comprises Cu, and the structure further comprises a second layer comprising an Au—Zn compound between the lead and the soldering material, the Au—Zn compound being a layer state, not a granular state.

17. The joined structure of claim 16, wherein a thickness of the second layer comprising the Au—Zn compound in a layer state is about 0.01 to about 0.1 μm.

18. The joined structure of claim 16 further comprising a first barrier metal layer between the land and the layer comprising the Au—Zn compound and a second barrier metal layer between the lead and the second layer comprising the Au—Zn compound.

19. The joined structure of claim 18, wherein the barrier metal layers comprise Ni.

20. The joined structure of claim 18, wherein the barrier metal layers comprise Ni layers and Au layers, the Ni layers being adjacent to the land and lead, respectively.

* * * * *